United States Patent
Yang et al.

(10) Patent No.: US 8,513,734 B2
(45) Date of Patent: *Aug. 20, 2013

(54) SWITCH MODE CONVERTER EMPLOYING DUAL GATE MOS TRANSISTOR

(75) Inventors: Hongning Yang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/069,158

(22) Filed: Mar. 22, 2011

(65) Prior Publication Data

US 2011/0169078 A1 Jul. 14, 2011

Related U.S. Application Data

(62) Division of application No. 12/060,105, filed on Mar. 31, 2008, now Pat. No. 7,910,991.

(51) Int. Cl.
*H01L 29/76* (2006.01)

(52) U.S. Cl.
USPC ......... 257/341; 257/328; 257/336; 257/343; 257/344; 257/345; 257/E21.418

(58) Field of Classification Search
USPC ......... 257/328, 336, 341, 343–345, E21.418
See application file for complete search history.

(56) References Cited

U.S. PATENT DOCUMENTS

| | | | |
|---|---|---|---|
| 5,254,890 A * | 10/1993 | Wang et al. | 327/384 |
| 5,973,367 A * | 10/1999 | Williams | 257/365 |
| 6,825,531 B1 | 11/2004 | Mallikarjunaswamy | |
| 7,229,873 B2 | 6/2007 | Colombo et al. | |
| 7,608,513 B2 | 10/2009 | Yang et al. | |
| 2001/0011747 A1 | 8/2001 | Emmerik et al. | |
| 2002/0053695 A1 | 5/2002 | Liaw et al. | |
| 2005/0067655 A1 | 3/2005 | Shibib et al. | |
| 2006/0024897 A1 | 2/2006 | Beasom | |
| 2006/0113601 A1 | 6/2006 | Shibib et al. | |

OTHER PUBLICATIONS

PCT Application No. PCT/US2009/033181; International Search Report and Written Opinion; mailed Aug. 26, 2009, 10 pages.

* cited by examiner

*Primary Examiner* — Andy Huynh
(74) *Attorney, Agent, or Firm* — Jackson Walker L.L.P.

(57) ABSTRACT

A disclosed power transistor, suitable for use in a switch mode converter that is operable with a switching frequency exceeding, for example, 5 MHz or more, includes a gate dielectric layer overlying an upper surface of a semiconductor substrate and first and second gate electrodes overlying the gate dielectric layer. The first gate electrode is laterally positioned overlying a first region of the substrate. The first substrate region has a first type of doping, which may be either n-type or p-type. A second gate electrode of the power transistor overlies the gate dielectric and is laterally positioned over a second region of the substrate. The second substrate region has a second doping type that is different than the first type. The transistor further includes a drift region located within the substrate in close proximity to an upper surface of the substrate and laterally positioned between the first and second substrate regions.

19 Claims, 5 Drawing Sheets

SWITCH MODE CONVERTER EMPLOYING DUAL GATE MOS TRANSISTOR

BACKGROUND

1. Field

The disclosed subject matter is in the field of semiconductor devices and, more particularly, power transistor semiconductor devices.

2. Related Art

Switch mode converters and regulators are widely used in power management applications including applications for cellular telephones and other mobile electronic devices. DC to DC switch mode converters convert an input DC voltage level to an output DC voltage level by temporarily storing input energy in a capacitor, a magnetic component such as an inductor, or both, and then releasing the stored energy to an output at a different voltage. The storing and releasing of energy is controlled by applying a square wave or other suitable switching input signal to a control terminal of a power transistor. The frequency of the pulse input is referred to as the switching frequency.

The switching frequency used with switch mode converters has increased steadily in an effort to use ever smaller inductors and capacitors. The trade-off for using higher switching frequencies is an increase in transient power loss as well as the risk of overheating on the power transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
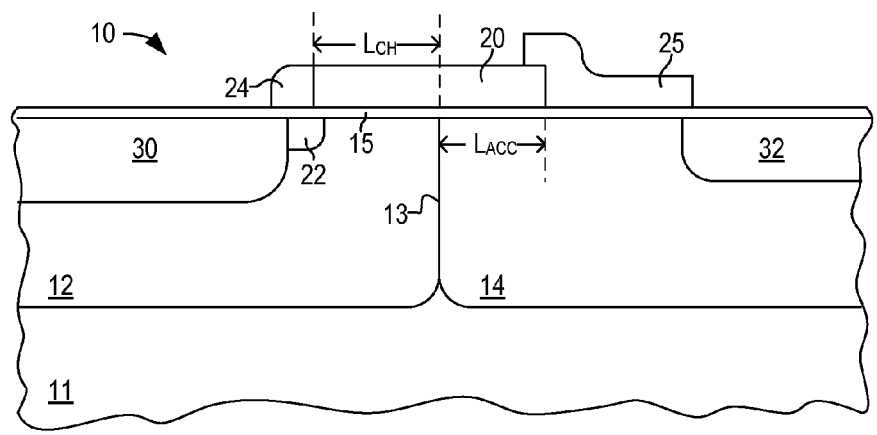
FIG. 1 is a partial cross sectional view of an embodiment of a lateral diffused metal oxide semiconductor power transistor.

In one aspect, a disclosed power transistor, suitable for use in a switch mode converter that is operable with a switching frequency exceeding 5 MHz or more, includes a gate dielectric layer overlying an upper surface of a semiconductor substrate and first and second gate electrodes overlying the gate dielectric layer. The first gate electrode is laterally positioned overlying a first region of the substrate. The first substrate region has a first type of doping or conductivity or polarity, which may be either n-type or p-type, but is p-type for a NMOS embodiment of the power transistor.

A second gate electrode of the power transistor overlies the gate dielectric and is laterally positioned over a second region of the substrate. The second substrate region has a second doping type that is different than the first type. For NMOS embodiments, the second doping type is n-type. The transistor further includes a drift region located within the substrate in close proximity to an upper surface of the substrate and laterally positioned between the first and second substrate regions.

A drift region underlies a lateral gap defined between the first and second gate electrodes. The drift region has the second doping type, i.e., n-type doping for NMOS embodiments. A boundary of the drift region is self-aligned to a boundary of the first gate electrode so that there is little lateral overlap between the drift region and the first gate electrode. The lack of substantial overlap leads to a desirable reduction in Cgd, the gate to drain capacitance of the resulting transistor. The reduction in Cgd enables the power transistor to operate at switching frequencies that would be prohibitive otherwise. The ability to operate at higher switching frequencies makes it feasible to implement the switch mode converter with smaller reactive components such as capacitors and/or inductors.

The substrate of the power transistor further includes first and second source/drain regions. The source/drain regions have the second doping type, i.e., n-type for NMOS embodiments. A boundary of the first source/drain region is aligned to the first gate electrode while a boundary of the second source/drain region is aligned to the second gate electrode. The first substrate region extends laterally between the first source/drain region and the drift region while the second substrate region extends laterally between the drift region and the second source/drain region. In some embodiments, a doping concentration of the drift region exceeds a doping concentration of the second substrate region and a doping concentration of the first source/drain region exceeds the doping concentration of the drift region.

The disclosed power transistor may include a lightly doped extension region at a lateral edge of the first source/drain drain region. The extension region has the second doping type, i.e., n-type for NMOS embodiments, but the impurity concentration of the extension region is at least an order of magnitude less than the doping concentration of the first source/drain region.

In some embodiments, the portion of the substrate in which the transistor elements are formed is a lightly doped p-type or n-type epitaxial layer. A first well may be introduced into the first substrate region and a second well may be introduced into the second substrate region. In NMOS embodiments, the first well may be a p-well and the second well may be an n-well. The first well may occupy substantially all of the first substrate region. Alternatively, the first well may be confined to a portion of the first region underlying the first source/drain region. In this embodiment, the impurity distribution of a p-type epitaxial layer occupies the remainder of the first substrate region.

In another aspect, a disclosed switch mode converter, suitable for use within a power management unit of a mobile electronic device such as a cellular telephone, includes a dual gate power transistor. The power transistor includes a first gate electrode overlying a first region of a substrate, a second gate electrode overlying a second region of the substrate, and a drift region within the substrate between the first and second substrate regions. The drift region underlies a gap defined between the first and second gate electrodes. The first substrate region extends laterally between a first source/drain region and the drift region while the second substrate region extends laterally between the drift region and a second source/drain region.

The first and second source/drain regions have a first type of conductivity, e.g., n-type, while the first substrate region has a second type of conductivity, e.g., p-type. The drift region and the second substrate region also have the first type of conductivity. In some embodiments, the doping concentration of the source/drain regions is greater than the doping concentration of the drift region, which is still greater than the doping concentration of the second substrate region.

A boundary of the drift region is self aligned to the first gate electrode, resulting in little or no capacitive overlap between the first gate electrode and the drift region. In some embodiments, for example, the lateral overlap between the first gate electrode and the drift region is less than approximately 20 nm. The first substrate region may include a first well and the second substrate region may include a second well. The first well may be substantially confined to a portion of the first substrate region underlying the first source/drain region while the remainder of the first substrate region is a lightly doped epitaxial layer.

The switch mode converter may be configured to receive a DC input voltage that is coupled to a source/drain terminal of the power transistor. The switch mode converter is configured to produce a DC output voltage having a value that differs from a value of the DC input voltage. A switch mode boost converter produces an output voltage that exceeds the input voltage while a switch mode buck converter produces an output voltage that is less than the input voltage. The switch mode converter may be operable to couple a switching input signal to the first gate electrode and further configured to couple a biasing signal to the second gate electrode. A switching frequency of the switching input signal may exceed 5 MHz or more.

In still another aspect, a disclosed method for fabricating a power transistor includes forming a gate dielectric layer overlying a semiconductor epitaxial layer of a substrate. A first gate electrode and a second gate electrode are formed overlying the gate dielectric. The first gate electrode is laterally positioned overlying a first region of the epitaxial layer while the second gate electrode is laterally positioned overlying a second region of the epitaxial layer. A lateral displacement between the first and second gate electrodes defines a gap overlying a boundary between the first and second regions of the epitaxial layer. A drift region is formed in the epitaxial layer underlying the gap with a boundary of the drift region self-aligned to the first gate electrode. Source/drain regions are formed in the first and second regions of the epitaxial layer.

The first region of the epitaxial layer may be a p-type region, in which case the second region of the epitaxial layer is an n-type region, the drift region is an n-type region having a doping concentration that is greater than a doping concentration of the second region, and the first and second source/drain regions comprise n-type regions having doping concentrations greater than the doping concentration of the drift region. The method may include forming a first well in the first region of the epitaxial layer and forming a second well in the second region of the epitaxial layer. Forming the first well may include forming a p-type well in the epitaxial layer, wherein a doping concentration of the p-type well exceeds a doping concentration of the epitaxial layer. In some embodiments, a boundary of the p-type well is aligned to the first gate electrode. In these embodiments, the p-type well may be substantially confined to a portion of the epitaxial layer underlying the first source/drain region. The method further includes forming a halo region adjacent to a lateral edge of the first source/drain region.

Referring now to the drawings, FIG. 1 depicts a power transistor 10 suitable for use in a switch mode converter. Power transistor 10 as shown in FIG. 1 is implemented with a traditional lateral diffused (LD) metal-oxide-semiconductor (MOS) configuration. in this configuration, power transistor 10 includes a silicon p-well 12 laterally adjacent to an n-well 14, which may also be referred to herein as extended drain region 14, with both overlying a p-type epitaxial layer 11.

A gate electrode 20 overlies a gate oxide 15 that overlies p-well 12 and an n-well 14. Gate electrode 20 straddles the boundary 13 between p-well 12 and extended drain region 14. A lightly doped extension region 22 of n-type doping is formed in p-well 12 using gate electrode 20 as an implant mask so that extension region 22 is laterally self-aligned to gate electrode 20. A dielectric spacer structure 24 laterally adjacent to gate electrode 20 serves as an implant mask that determines the lateral alignment of a heavily doped n-type source region 30. A dielectric structure referred to as silicide block 25 formed adjacent to an opposing side of gate electrode 20 determines a lateral alignment of a heavily doped n-type drain region 32.

The lateral overlap between gate electrode 20 and extended drain region 14 is sometimes referred to as the accumulation length ($L_{ACC}$). $L_{ACC}$ beneficially contributes to the performance and/or reliability of power transistor 10 as a high power device by reducing maximum electric fields, reducing hot carrier injection (HCl) damage, and lowering the resistance in extended drain region 14.

Inherent in LDMOS power transistor 10 is a capacitance, referred to herein as Cgd, between gate electrode 20 and drain region 32. Cgd is a function of the gate dielectric thickness, the dielectric constant of the gate dielectric, and the magnitude of $L_{ACC}$. Because $L_{ACC}$ is substantial in the embodiment of power transistor 10 depicted in FIG. 1, the Cgd of power transistor 10 is undesirably large for use in switch mode regulators that operate at high frequencies, e.g., switching frequencies greater than approximately 5 MHz. Higher frequency converters and regulators are becoming more prevalent in an attempt to enable the use of smaller capacitors and/or magnetic components.

Figure 2:
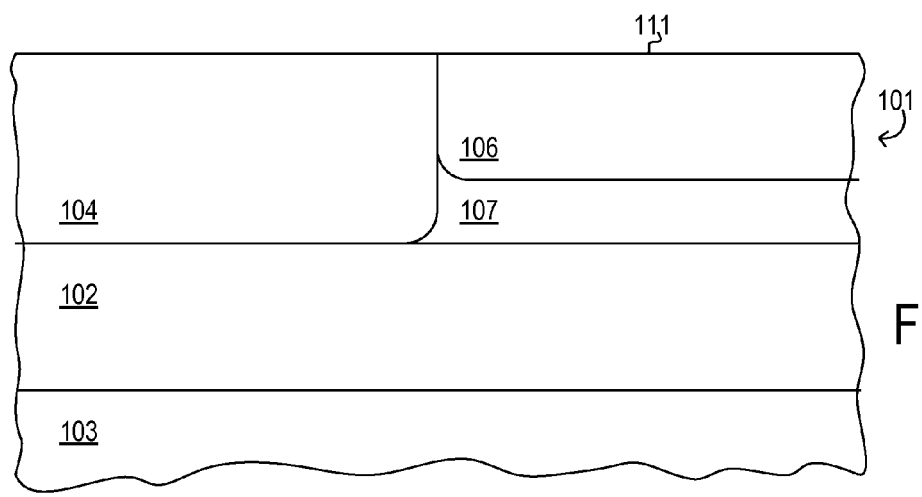
FIG. 2 is a partial cross sectional view of a wafer at a selected stage in a fabrication process.

Referring now to FIG. 2 through FIG. 8, selected steps in an embodiment of a semiconductor fabrication process for making a power transistor for high frequency switching applications are illustrated using partial cross sectional views of a semiconductor wafer 101. In FIG. 2, wafer 101 is shown as including a p-well 104 laterally adjacent to an n-well 106. The p-well 104 overlies a buried layer 102, which overlies an epitaxial (epi) layer 103. N-well 106 overlies a p-buried layer (PBL) 107 that overlies buried layer 102. Buried layer 102, p-well 104, n-well 106, and PBL 107 may be formed with respective ion implantations. A single ion implantation process is used to form implant n-well 106 and PBL 107.

In the described embodiments, buried layer 102 is an n-type layer and epi layer 103 is a p-type layer while, in other embodiments, buried layer 102 may be a p-type layer and epi layer 103 may be an n-type layer. Buries layer 102 serves to isolate p-well 104. Similarly, PBL 107 may be a p-type layer that serves to isolate n-well 106. In this embodiment, Buried layer 102 isolates PBL 107 as well as p-well 104. Epi layer 103 may be grown epitaxially on a bulk substrate (not depicted) of a semiconductor such as silicon or a dielectric such as a silicon oxide compound. In some embodiments, epi layer 103 is a p-type layer having a doping density of approximately $2\times10^{15}$ dopants/cm$^3$ (2E15/cm$^3$), p-well 104 has a doping density of approximately 6E17/cm$^3$, and n-well region 106 has a doping density of approximately 1E17/cm$^3$. In some embodiments, epi layer 103 and p-well 104 are doped with a p-type impurity such as boron while n-well 106 is doped with an n-type impurity such as phosphorus or arsenic.

In some embodiments, a depth of p-well 104, below an upper surface 111 of wafer 101, is in the range of approximately 800 to 1600 nm and a depth of n-well 106 is in the range of 600 to 1400 nm. In the depicted embodiment, p-well 104 is 200 nm deeper than n-well 106.

Figure 3:
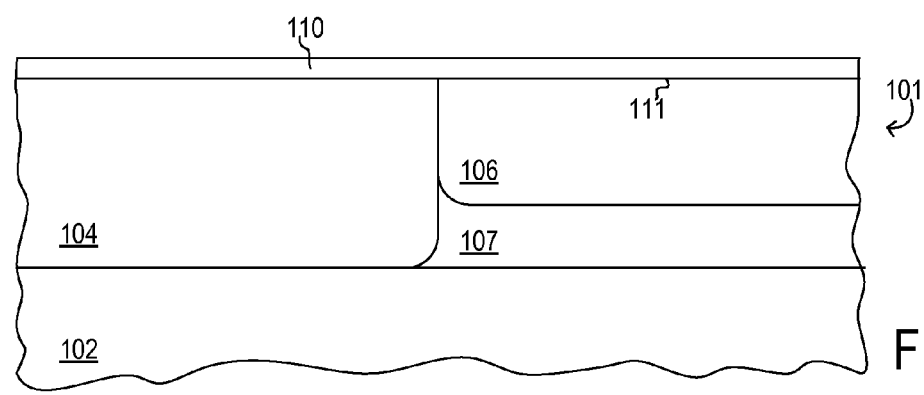
FIG. 3 depicts processing subsequent to FIG. 2 in which a gate dielectric layer is formed overlying the wafer.

Referring to FIG. 3, a gate dielectric 110 has been formed overlying an upper surface 111 of wafer 101. Gate dielectric 110 may be a thermally formed dielectric such as a thermally formed silicon dioxide or another thermally formed silicon oxide compound. In other embodiments, gate dielectric 110 may be a "high K" dielectric such as a silicon nitrogen compound or a metal oxide dielectric such as HfO. An effective oxide thickness of gate dielectric 110 may be in the range of approximately 1 to 5 nm, where the effective oxide thickness refers to the thickness of the layer divided by a ratio of the dielectric constant of gate dielectric 110 to the dielectric constant of silicon dioxide. The thickness of gate dielectric 110 as shown is not to scale, but is exaggerated for the sake of clarity.

Figure 4:
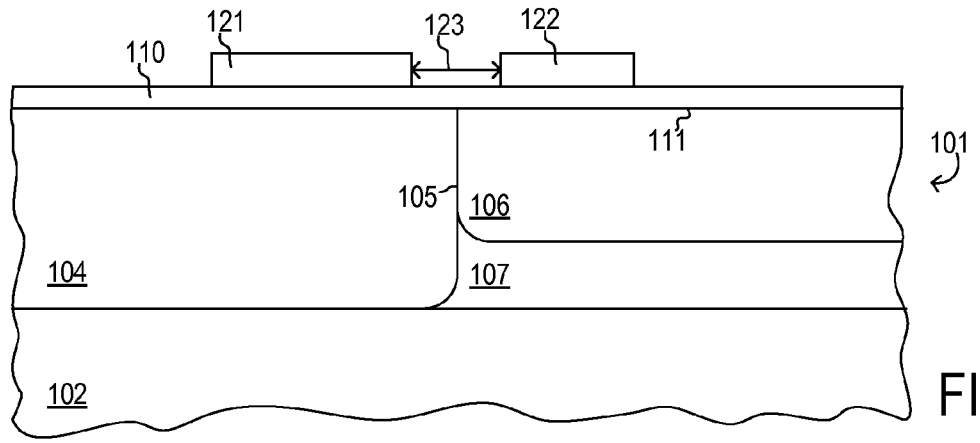
FIG. 4 depicts processing subsequent to FIG. 3 in which first and second gate electrodes are formed overlying the gate dielectric layer.

Referring now to FIG. 4, a first gate electrode 121 and a second gate electrode 122 have been formed overlying gate dielectric 110. First gate electrode 121 is laterally positioned overlying p-well 104 and second gate electrode 122 is laterally positioned overlying n-well 106. A lateral displacement between first and second gate electrodes 121 and 122 defines a lateral gap 123 that overlies the junction 105 between p-well 104 and n-well 106. In some embodiments, the size of lateral gap 123 is in the range of approximately 100 to 300 nm. A lateral dimension of first gate electrode 121 may be in the range of approximately 200 to approximately 400 nm and a lateral dimension of second gate electrode 122 may be in the range of approximately 100 to approximately 200 nm.

First gate electrode 121 and second gate electrode 122 may be formed simultaneously with conventional deposition, lithographic, and etch processing. In some embodiments, gate electrodes 121 and 122 are heavily doped polycrystalline silicon while, in other embodiments, gate electrodes 121 and 122 may include various metals and other conductive materials.

Figure 5:
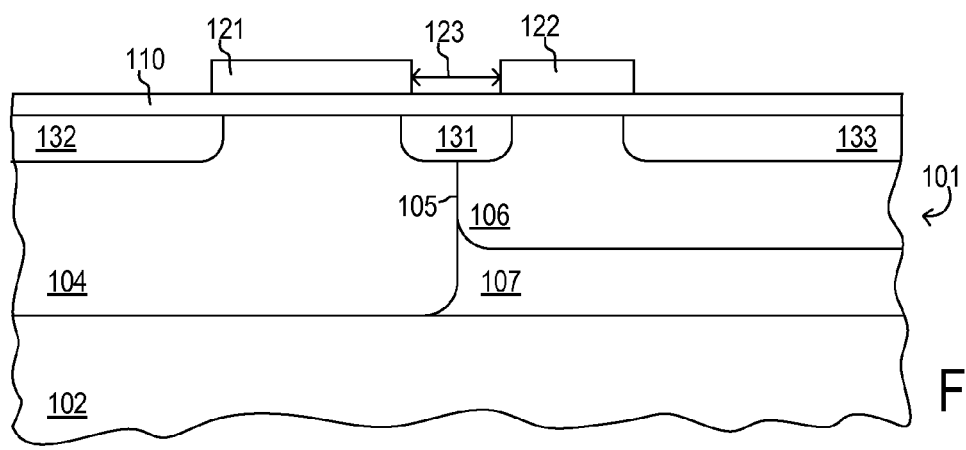
FIG. 5 depicts processing subsequent to FIG. 4 in which extension regions and a drift region are introduced into the substrate.

Referring to FIG. 5, lightly doped n-type regions, referred to herein as LDD regions 131, 132, and 133 are formed in wafer 101. LDD regions 131, 132, and 133 may be formed by implanting an impurity such as arsenic or phosphorous into wafer 101 using first and second gate electrodes 121 and 122 as implant masks. In this embodiment, LDD regions 131, 132, and 133 are laterally self-aligned to gate electrodes 121 and 122. LDD regions 132 and 133 may serve as extension implants for source/drain regions to be formed in subsequent processing steps. The LDD region 131 underlying gap 123 between first and second gate electrodes 121 and 122 is referred to herein as drift region 131. Since the lateral overlap between first gate electrode 121 and self-aligned drift region 131 is minimal, e.g., 20 nm or less, and drift region 131 is small, e.g., less than 300 nm laterally and less than approximately 100 nm in depth, the depicted structure has an inherently small capacitance between first gate electrode 121 and a drain region that will be formed subsequently within n-well 106. It is estimated that Cgd of transistors fabricated as described in FIG. 2 through 6 herein is about 5 to 20 times lower than the Cgd of a traditional LDMOS transistor such as power transistor 10 depicted in FIG. 1.

In the embodiment depicted in FIG. 5, drift region 131 is formed simultaneously with the formation of LDD regions 132 and 133. In other embodiments, separate implants and masking steps may be employed to obtain a doping profile for drift region 131 that is independent of the doping requirements for regions 132 and 133. The dopant type of drift region 131 is the same as the dopant type of either p-well 104 or n-well 106. In some embodiments, the doping concentration of drift region 131 may differ from the doping concentration of p-well 104, n-well 106, or both. In any embodiments where the doping concentration of drift region 131 is approximately the same as the doping concentration of its like-type well region, i.e., either p-well 104 or n-well 106, drift region 131 may be difficult to distinguish from its like-type well region and it may appear, in these embodiments, that drift region 131 exists only in its opposite type well region.

Figure 6:
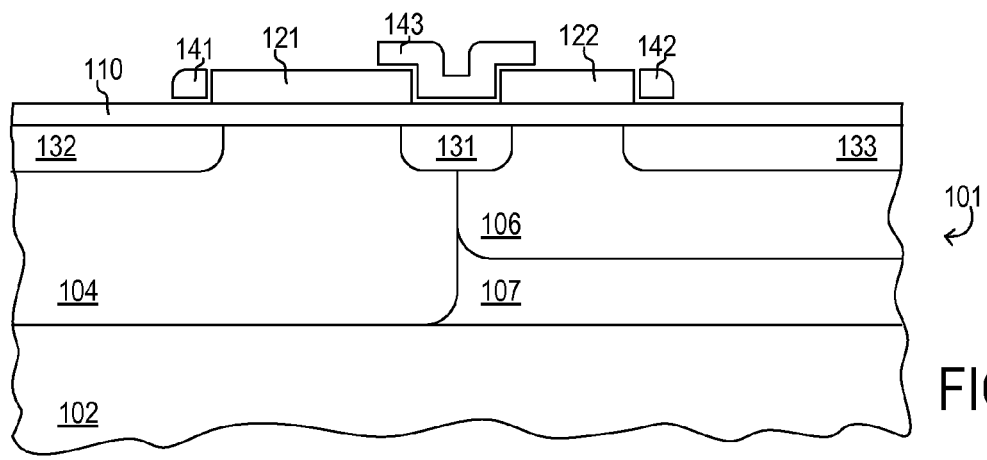
FIG. 6 depicts processing subsequent to FIG. 5 in which spacers and blocking structures are formed.

Referring now to FIG. 6, spacer structures 141, 142, and 143 are formed adjacent to sidewalls of gate electrodes 121 and 122. Spacers 141, 142, and 143 may be composed of a dialectic material such as various silcon-oxide compounds, silicon-nitrogen compounds, silicon-oxygen-nitrogen compounds, or a combination thereof. Spacer structure 143, which overlies drift region 131, may also be referred to as silicide blocking structure 143.

Figure 7:
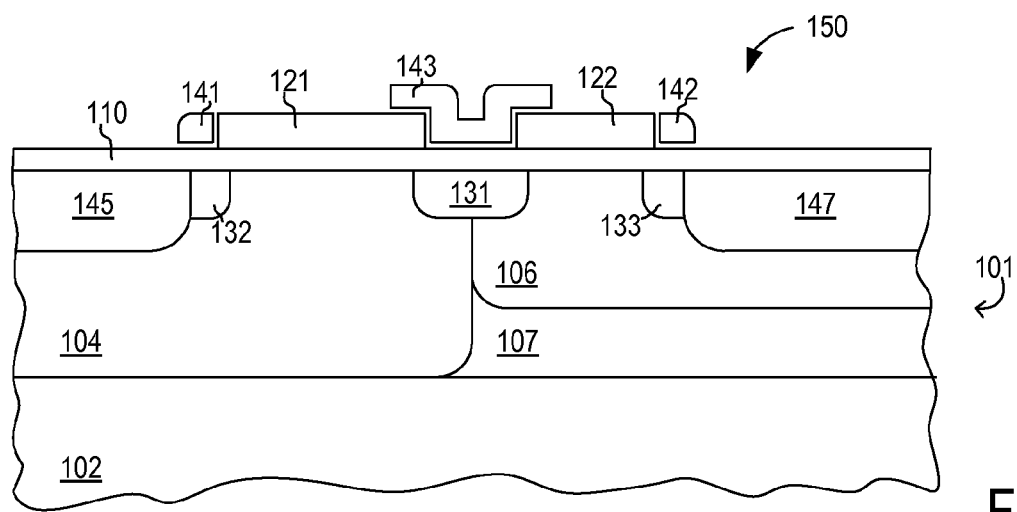
FIG. 7 depicts processing subsequent to FIG. 6 in which source/drain regions are formed.

Referring now to FIG. 7, heavily doped n-type source/drain regions 145 and 147 are formed in p-well 104 and n-well 106 respectively using a high dose implant followed by an activation anneal. In some embodiments, source/drain regions 145 and 147 have an impurity concentration of greater than approximately 1E19/cm$^3$ and a depth in the range of approximately 75 to approximately 200 nm. With the inclusion of source/drain regions 145 and 147, FIG. 7 depicts an embodiment of a dual gate LDMOS power transistor 150.

As depicted in FIG. 7, switch transistor 150 is powered by signals applied to first and second gate electrodes 121 and 122. More particularly, FIG. 7 depicts a first voltage signal Vg1 applied to first gate electrode 121 and a second voltage signal Vg2 applied to second gate electrode 122. In some embodiments, Vg1 represents a square wave or other suitable switching input signal and Vg2 represents a DC biasing voltage. In the case of a boosting power converter, Vg2 may be biased by the output of the converter itself, i.e., not biased from an external source. In other embodiments, Vg2 may be supplied by an external and preferably regulated power source. The operation and efficiency of power transistor 150 are discussed below with respect to FIG. 9 and FIG. 10.

Figure 8:
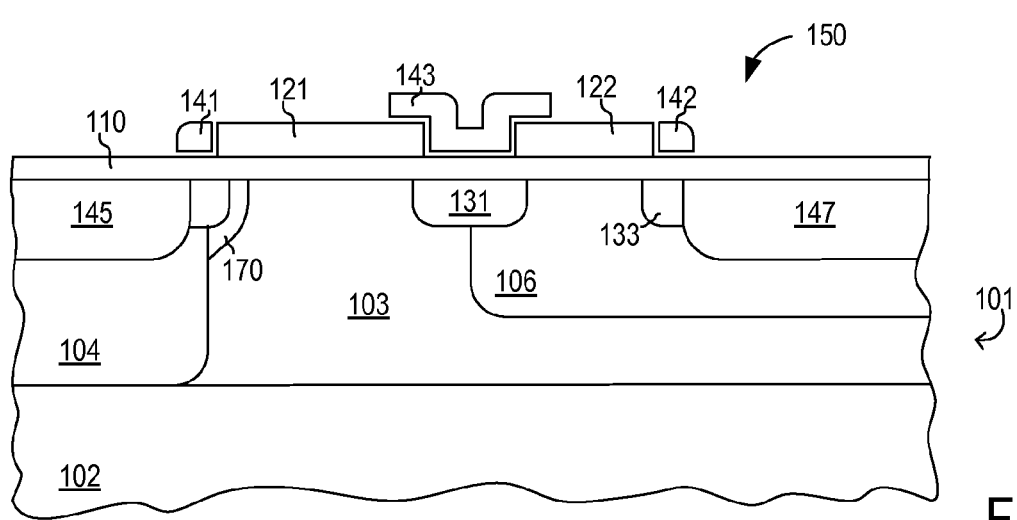
FIG. 8 depicts an alternative to the processing represented by FIG. 7.

FIG. 8 depicts an alternative embodiment of power transistor 150. In the embodiment of FIG. 8, p-well 104 has been laterally aligned to an edge of first gate electrode 121 so that p-well 104 is substantially confined to a region under source/drain region 145. In this embodiment, epi layer 103 extends to an upper surface of wafer 101 underlying first gate electrode 121. A halo layer 170 forms a heavily doped layer of a p-type impurity enveloping the LDD region 132 and source/drain region 145. Halo layer 170 prevents surface punch through while p-well 104 underlying source/drain region 145 and aligned with an edge of first gate electrode 121 prevents bulk punch through. The lower concentration of carriers in epi layer 103 may beneficially result in a higher drive current than the drive current of FIG. 7, although Cgd is somewhat greater in FIG. 8.

Figure 9:
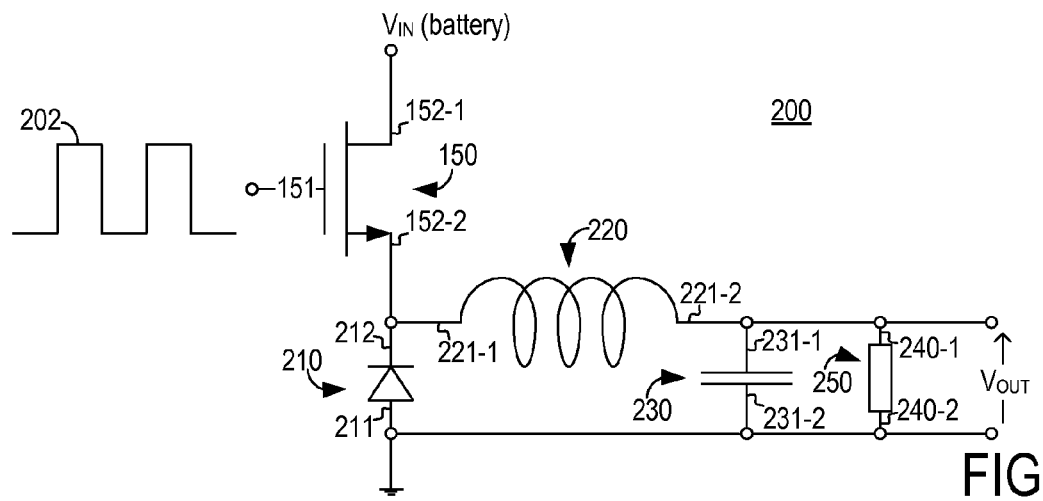
FIG. 9 depicts selected elements of a switch mode step down or buck converter including the disclosed power transistor.
Figure 10:
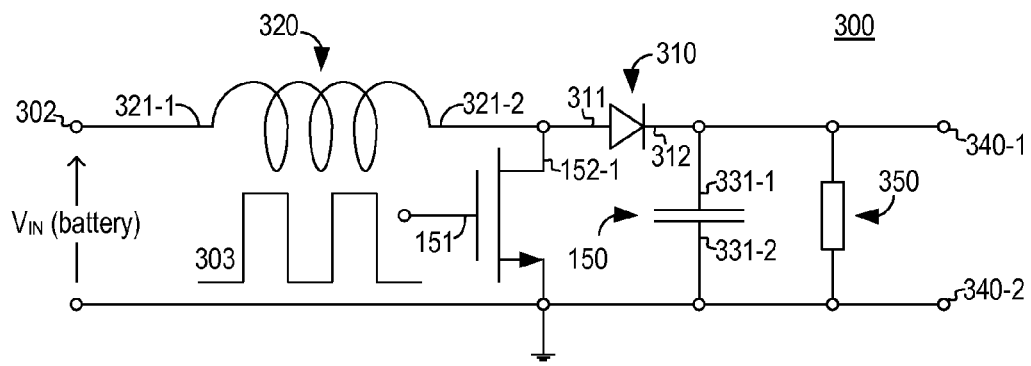
FIG. 10 depicts selected elements of a switch mode step up or boost converter including the disclosed power transistor.

Referring now to FIG. 9 and FIG. 10, two DC to DC converters that implement power transistor 150 are described. In FIG. 9, selected elements of an embodiment of a switching DC to DC step down converter (buck converter) 200 are depicted. In FIG. 10, selected elements of an embodiment of a switching DC to DC step up converter (boost converter) 300 are depicted. The ability of power transistor 150 to enable high frequency operation at reduced power consumption is more beneficial in the case of step up booster 300, power transistor 150 is suitable for use in both types of converters and both are described herein. In FIG. 9, buck converter 200 receives a voltage input (VIN), and a switching input signal 202, and produces a voltage output (VOUT) where the magnitude of VOUT is less than the magnitude of VIN. Buck converter 200 is suitable for use in a power management module of an electronic device and employs a dual gate, LD MOS power transistor 150 as described above. Using power transistor 150, buck converter 200 may be operable for applications employing switching frequencies exceeding 5 MHz and, still more preferably, equal to or exceeding 10 MHz.

In the depicted embodiment of buck converter 200, switching input signal 202 is received by or applied to a control terminal 151 of power transistor 150. The input voltage, VIN, is connected to a first current terminal 152-1 of power transistor 150. A second current terminal 152-2 of power transistor 150 is connected to a cathode 212 of a diode 210. An anode 211 of diode 210 is connected to circuit ground. The input voltage, VIN, may, in some embodiments, represent the voltage supplied by a battery or other form of power supply for the electronic device.

A first terminal 221-1 of an inductor 220 of buck converter 200 is connected to cathode 212 of diode 210. A second terminal 221-2 of inductor 220 is connected to a first terminal 231-1 of a capacitor 230. A second terminal 231-2 of capacitor 230 is connected to circuit ground. Capacitor 230 is connected across first and second output terminals 240-1 and 240-2 of buck converter 200. A load 250 is shown connected between output terminals 240-1 and 240-2.

During an on stage, i.e., an interval when switching input signal 202 is asserted, buck converter 200 transfers energy to load 250 by taking energy from a power source, Vin, while storing and unloading excess energy in the reactive components, namely inductor 220 and capacitor 230 while maintaining approximately constant power in the load, R. During an off stage, i.e., an interval when switching input signal 202 is not asserted, previously stored energy in inductor 220 and capacitor 230 is unloaded to maintain approximately constant power in the load.

Power transistor 150 operates in three primary regions of a conventional I-V chart for a MOS transistor. During the on stage, power transistor 150 operates in an on stage state in which the source/drain voltage Vds is relatively small and the source/drain current is high. During the off stage, power transistor 150 operates in an off stage state in which the source/drain voltage is variable, but the drain current is not sufficiently greater than a leakage current value. During transient switching from the on stage state to the off stage state, power transistor 150 operates in a transient region in which Vds and Ids may be both large.

An efficiency measure of power transistor 150 is reflected in the ratio of the power dissipated in load 250 to the total power dissipated, namely, the power dissipated in load 250 plus the sum of the power dissipated in power transistor 150, the power dissipated in diode 210, and the transient power, representing the power dissipated during the power state transitions. Qualitatively, it is apparent that efficiency is improved when the transient power dissipation is minimized and when the power dissipated in the power transistor itself is reduced.

For purposes of enabling high frequency operation at reduced power consumption, the key power consumption component is the transient power loss. The transient power loss may be represented as the product of the frequency and an average of the transient power dissipated per cycle. The efficiency of power transistor 150 may be improved by reducing the dissipated transient power per cycle, referred to more simply hereafter as the transient power.

Reduction of the transient power may be achieved by minimizing gate charge, reducing the gate to drain capacitance, Cgd, or both. The value of Cgd for the power transistor 10 depicted in FIG. 1 is significant because of the extent of overlap between the gate electrode and channel region of the substrate, represented by the accumulation length $L_{ACC}$. In contrast, however, Cgd for power transistor 150 as depicted in FIG. 7 or FIG. 8 is relatively small consistent with the very small amount of lateral overlap between first gate electrode 121 and drift region 131. Accordingly, power transistor 150 has substantially less transient power loss than power transistor 10.

Achieving the smaller Cgd enabled by the use of first gate electrode 121 and drift region 131 eliminates the relatively long drift region that is needed in conventional power transistors to enable high voltage operation. In power transistor 150, however, the use of two physically distinct gate electrodes facilitates the reduction of Cgd that is needed for high frequency operation without comprising the high voltage stability and operation of the power transistor. In this configuration, second gate electrode 122 supports the reduction of gate-drain capacitance and the reduction of the transient power dissipation. The region under second gate electrode 122 also serves as an effective drift region to sustain high drain voltage bias and thereby support high voltage operation. Second gate electrode 122 can be biased, in the case of booster-type switches, by output DC voltage of the switch.

Referring now to FIG. 10, selected elements of an embodiment of a step up voltage converter (boost converter) 300 are depicted. The depicted embodiment of boost converter 300 employs a dual gate, LD MOS power transistor 150 as described herein and is suitable for use in a power management unit of an electronic device such as a cellular telephone or another type of hand held device. By employing a dual gate LD MOS power transistor as described herein, boost converter 300 is operable at switching frequencies exceeding 5 MHz and, still more preferably, switching frequencies equal to or exceeding 10 MHz.

In the depicted embodiment, boost converter 300 receives the input voltage, $V_{IN}$, at an input terminal 302, which is connected to a first terminal 321-1 of an inductor 320. A second terminal 321-2 of inductor 320 is connected to the first current terminal 152-1 of power transistor 150. The control terminal 151 of power transistor 150 is configured to receive the switching input signal 302, which may be produced by a conventional pulse width modulation (PWM) circuit that is not depicted.

The first current terminal 152-1 of power transistor 150 is connected to anode 311 of diode 310. A cathode 312 of diode 310 is connected to a first terminal 331-1 of a capacitor 330. A second terminal 331-2 of capacitor 330 is connected to circuit ground such that capacitor 330 is connected in parallel with output terminals 340-1 and 340-2, between which an output load 350 is connected.

Figure 11:
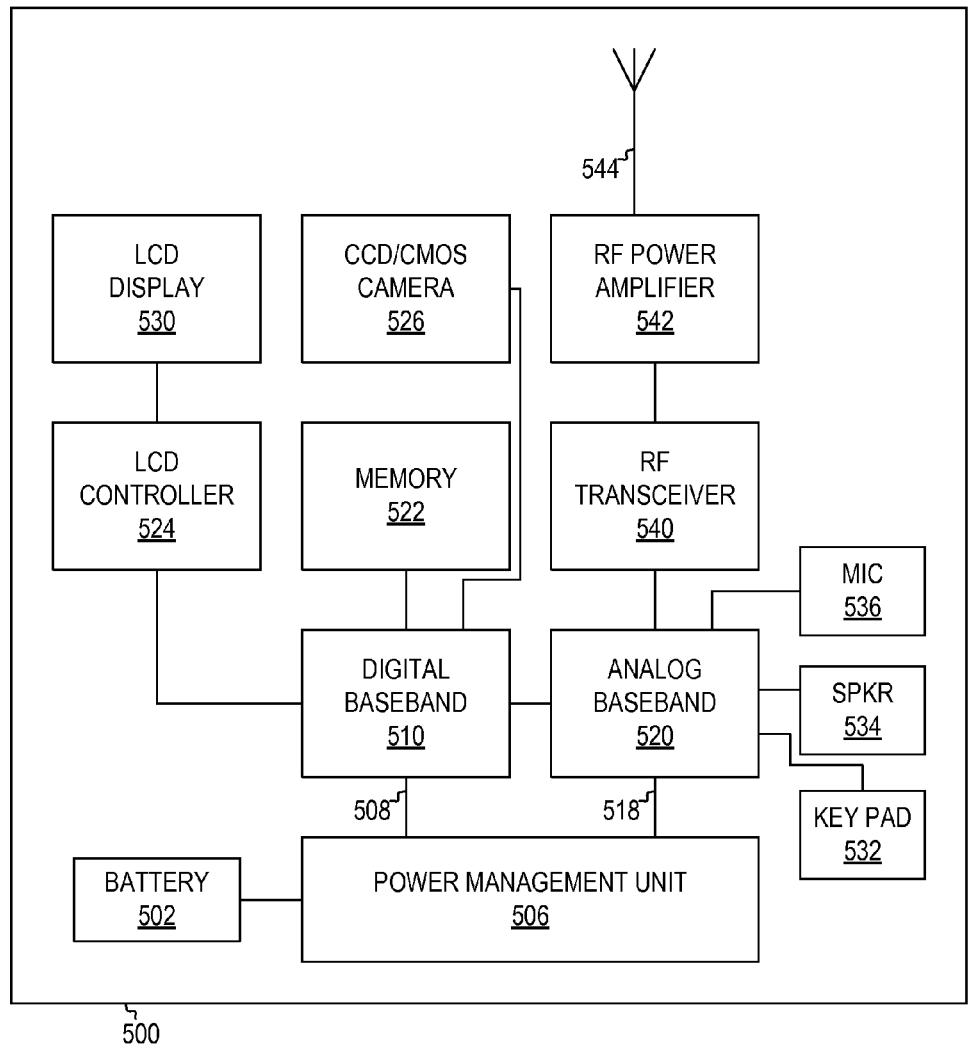
FIG. 11 depicts selected elements of a mobile electronic device including a power management unit incorporating a disclosed switch mode converter and a disclosed power transistor.

Referring now to FIG. 11, a block diagram depicts selected elements of an embodiment of a mobile electronic device 500. Mobile electronic device 500 includes wireless communication functionality and may represent a cellular telephone or other type of mobile device that supports wireless telephony.

In the depicted embodiment, mobile electronic device 500 includes a battery 502 that provides a supply signal to a power management unit 506. Power management unit 506 may include a battery charger (not depicted) and/or an AC adapter (not depicted) so that an AC power source can be used to power mobile electronic device 500, recharge battery 502, or both.

Power management unit 506 generates at least one DC supply signal 508 that provides power to a digital baseband 510, an analog baseband 520, or both. In some embodiments, power management unit 506 provides a first supply signal 508 to digital baseband 510 and a second supply signal 518 to analog baseband 520. In some embodiments, the supply signal(s) generated by power management unit 506 may have a magnitude that is either greater than or less than a magnitude of a supply signal provided by battery 502 or by the output of an AC adapter unit. In these embodiments, power management unit 506 may include a switching buck converter, such as buck converter 200 depicted in FIG. 9, that employs at least one dual gate LD MOS power transistor 150, a switching boost converter, such as boost converter 300 depicted in FIG. 10, that employs at least one dual gate LD MOS power transistor 150, or both.

In the depicted embodiment, digital baseband 510 interfaces with one or more types of memory 522, an LCD controller 524 that controls an LCD display screen 530, and a CCD/CMOS camera 526. Analog baseband 520 interfaces with various elements including a keypad 532, a speaker 534, a microphone 536, and a radio frequency (RF) transceiver 540. RF transceiver 540 is connected to an RF power amplifier 542 that applies an RF communication signal to an RF antenna 544. Depending upon the implementation, analog baseband 520 and its associated devices may support any of various cellular communication protocols including third generation (3G) protocols or second generation (2G) protocols including 2.5G protocols. By incorporating dual gate LD MOS power transistors, mobile electronic device 500 may be operable with switching frequency exceeding 5 MHz or more and may, therefore, be able to achieve reliable power conversion using smaller reactive components including inductors and capacitors than would be achievable in an electronic device employing conventional power transistors in its power management unit.

Although the invention is described herein with reference to specific embodiments, various modifications and changes can be made without departing from the scope of the present invention as set forth in the claims below. For example, the depicted embodiments may be implemented with various materials for the gate electrodes. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A switch mode converter suitable for use within a power management unit of a mobile electronic device, the switch mode converter comprising:

a transistor including a first gate electrode overlying a first substrate region of a substrate, a second gate electrode overlying a second substrate region of the substrate, and a drift region within the substrate between the first substrate region and the second substrate region, the drift region underlying a gap defined between the first gate electrode and the second gate electrode;

wherein the first substrate region extends laterally between a first source/drain region and the drift region and wherein the second substrate region extends laterally between the drift region and a second source/drain region;

wherein the first source/drain region has a first type of conductivity, the first substrate region has a second type of conductivity that is different than the first type of conductivity, the drift region has the first type of conductivity, the second substrate region has the first type of conductivity, and the second source/drain region has the first type of conductivity.

2. The switch mode converter of claim 1, wherein a boundary of the drift region is laterally aligned to the first gate electrode.

3. The switch mode converter of claim 2, wherein a lateral overlap between the first gate electrode and the drift region is less than approximately 20 nm.

4. The switch mode converter of claim 1, wherein a doping concentration of the drift region exceeds a doping concentration of the second substrate region.

5. The switch mode converter of claim 1, wherein the first substrate region is within a first well and the second substrate region is within a second well.

6. The switch mode converter of claim 1, further comprising a first well substantially confined to a portion of the substrate underlying the first source/drain region.

7. The switch mode converter of claim 1, wherein the switch mode converter is configured to receive a DC input voltage that is coupled to a source/drain terminal of the transistor and further configured to produce a DC output voltage having a value that differs from a value of the DC input voltage.

8. The switch mode converter of claim 7, wherein the switch mode converter is configured to couple a switching input signal to the first gate electrode and further configured to couple a biasing signal to the second gate electrode.

9. The switch mode converter of claim 8, wherein a switching frequency of the switching input signal exceeds approximately 5 MHz.

10. A switch mode converter configured for use in a power management unit, the switch mode converter, comprising:

an input node configured to receive an input voltage;

a dual gate transistor operably coupled to the input node, the dual gate transistor including a first gate electrode, a second gate electrode, a first current terminal, and a second current terminal, wherein the first gate electrode overlies a first substrate region extending between a first source/drain region and a drift region, a second gate electrode overlies a second substrate region extending between a second source/drain region and the drift region, and the drift region underlies a gap defined between the first gate electrode and the second gate electrode; and an output port operably coupled to the dual gate transistor and configured to provide an output voltage to a load.

11. The switch mode converter of claim 10, further comprising a capacitor, a diode, and an inductor, wherein the capacitor is connected in parallel with the output port and wherein a first terminal of the diode, a first terminal of the inductor, and the first current terminal of the transistor are connected to a common node.

12. The switch mode converter of claim 11, wherein the input node is connected to the second current terminal of the dual gate transistor, the first terminal of the diode is a cathode terminal, and a second terminal of the inductor is connected to the output port.

13. The switch mode converter of claim 11, wherein the input node is connected to a second terminal of the inductor, the second current terminal of the dual gate transistor is connected to ground, the first terminal of the diode is an anode terminal, and a cathode terminal of the diode is connected to the output port.

14. The switch mode converter of claim 10, wherein a boundary of the drift region is laterally aligned to the first gate electrode.

15. The switch mode converter of claim 10, wherein:
the first source/drain region, the drift region, the second substrate region, and the second source/drain region share a first conductivity type and wherein the first substrate region has a second conductivity type that differs from the first conductivity type; and
a doping concentration of the first source/drain region exceeds a doping concentration of the drift region and wherein the doping concentration of the drift region exceeds a doping concentration of the second substrate region.

16. The switch mode converter of claim 15, wherein the first substrate region and the second substrate region overlie a first buried layer having the first conductivity type and the first buried layer overlies an epitaxial layer having the second conductivity type.

17. The switch mode converter of claim 16, wherein a second buried layer having the second conductivity type overlies the first buried layer and wherein a second well region having the first conductivity type overlies a portion of the second buried layer extending from the drift region to the second source/drain region.

18. The switch mode converter of claim 17, further comprising a first well region having the second conductivity type, wherein the first well region overlies a portion of the first buried layer extending from the first source/drain region to the drift region.

19. The switch mode converter of claim 17, further comprising a first well region having the second conductivity type, wherein the first well region overlies a portion of the first buried layer that underlies the first source/drain region.

* * * * *